United States Patent
Kang et al.

(10) Patent No.: US 11,569,678 B2
(45) Date of Patent: Jan. 31, 2023

(54) SYSTEM FOR ESTIMATING INITIAL SOC OF LITHIUM BATTERY OF VEHICLE AND CONTROL METHOD THEREOF

(71) Applicants: HYUNDAI MOTOR COMPANY, Seoul (KR); KIA MOTORS CORPORATION, Seoul (KR); HONGIK UNIVERSITY INDUSTRY—ACADEMIA COOPERATION FOUNDATION, Seoul (KR)

(72) Inventors: Seung Won Kang, Anyang-si (KR); Jee Hwan Jeon, Seoul (KR); Hyun Jong Oh, Seoul (KR); Sung Jin Park, Seoul (KR); Min Gyu Park, Daejeon (KR)

(73) Assignees: Hyundai Motor Company, Seoul (KR); Kia Motors Corporation, Seoul (KR); Hongik University Industry-Academia Cooperation Foundation, Seoul (KR)

( * ) Notice: Subject to any disclaimer, the term of this patent is extended or adjusted under 35 U.S.C. 154(b) by 1336 days.

(21) Appl. No.: 15/946,755

(22) Filed: Apr. 6, 2018

(65) Prior Publication Data
US 2019/0184846 A1    Jun. 20, 2019

(30) Foreign Application Priority Data
Dec. 15, 2017  (KR) .......................... 10-2017-0173180

(51) Int. Cl.
*H01M 10/44*  (2006.01)
*H01M 10/46*  (2006.01)
(Continued)

(52) U.S. Cl.
CPC ............ *H02J 7/1446* (2013.01); *B60L 58/12* (2019.02); *G01R 31/387* (2019.01);
(Continued)

(58) Field of Classification Search
CPC ...... H02J 7/0048; H02J 7/0049; H02J 7/1446; H02J 7/04; H02J 7/007194; H02J 7/00716;
(Continued)

(56) References Cited

U.S. PATENT DOCUMENTS 8,669,741 B2   3/2014   Seo et al.
9,187,007 B2   11/2015  Li et al.
(Continued)

FOREIGN PATENT DOCUMENTS

KR   10-2004-0110029 A   12/2004
KR   10-2009-0109366 A   10/2009
(Continued)

OTHER PUBLICATIONS

Office Action issued in corresponding Korean application No. 10-2017-0173180, dated May 31, 2022.

*Primary Examiner* — Edward Tso
(74) *Attorney, Agent, or Firm* — Morgan, Lewis & Bockius LLP

(57) ABSTRACT

A vehicle includes a vehicle battery; a vehicle sensor configured to detect a current, a voltage and a temperature of the vehicle battery; and an alternator configured to output a target voltage to the vehicle battery. A controller is configured to calculate state of charge (SOC) estimation based on the current, voltage and temperature of the vehicle battery, calculate an initial SOC based on a direct current internal resistance (DCIR) map and apply the initial SOC to the SOC estimation, when an open circuit voltage (OCV) is maintained in a predetermined range after engine-off, and adjust (Continued)

an available SOC range based on a difference between an actual battery charge current amount, to which the initial SOC is applied, and the calculated SOC estimation.

17 Claims, 12 Drawing Sheets

(51) Int. Cl.
*H02J 7/14* (2006.01)
*G01R 31/3828* (2019.01)
*B60L 58/12* (2019.01)
*G01R 31/387* (2019.01)
*G01R 31/3842* (2019.01)
*H02J 7/00* (2006.01)

(52) U.S. Cl.
CPC ..... *G01R 31/3828* (2019.01); *G01R 31/3842* (2019.01); *H02J 7/00716* (2020.01); *H02J 7/007192* (2020.01); *H02J 7/007194* (2020.01); *H02J 7/0048* (2020.01); *H02J 7/0049* (2020.01); *H02J 2310/48* (2020.01)

(58) Field of Classification Search
CPC .. G01R 31/387; G01R 31/3842; G01R 31/36; G01R 31/3648; G01R 31/382; B60L 2240/549; B60L 2240/547; B60L 58/12
USPC ........ 320/104, 107, 132, 149; 324/426, 427, 324/428, 433; 340/636.1, 636.11, 636.12, 340/636.13, 636.15, 636.19, 636.2; 702/63, 64
See application file for complete search history.

(56) References Cited

U.S. PATENT DOCUMENTS

| | | | |
|---|---|---|---|
| 2008/0074082 A1 | 3/2008 | Tae et al. | |
| 2013/0300425 A1* | 11/2013 | Shiraishi | H02J 7/007 324/426 |
| 2017/0158078 A1* | 6/2017 | Kim | B60L 53/53 |

FOREIGN PATENT DOCUMENTS

| | | |
|---|---|---|
| KR | 10-2010-0012890 A | 2/2010 |
| KR | 10-2015-0019190 A | 2/2015 |
| KR | 10-2016-0007870 A | 1/2016 |

* cited by examiner

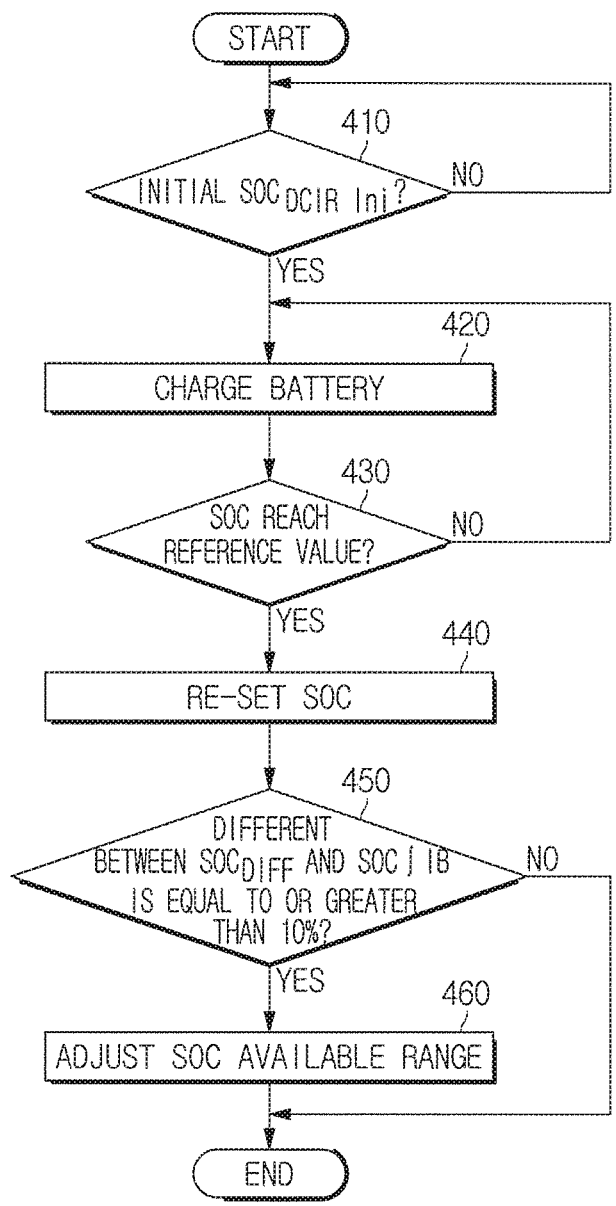

SYSTEM FOR ESTIMATING INITIAL SOC OF LITHIUM BATTERY OF VEHICLE AND CONTROL METHOD THEREOF

CROSS-REFERENCE TO RELATED APPLICATION(S)

This application claims the benefit of priority to Korean Patent Application No. 10-2017-0173180, filed on Dec. 15, 2017 in the Korean Intellectual Property Office, the disclosure of which is incorporated herein by reference.

TECHNICAL FIELD

The present disclosure relates to a vehicle and a control method thereof.

BACKGROUND

As for a vehicle to which a lithium battery is applied, there may be a region in which it is difficult to set an initial state of charge (SOC) by an Open Circuit Voltage (OCV) when a chemical stabilization time elapses after engine-off.

Particularly, in a case of a 12V lithium battery, there is a flat region in which a difference in the OCV according to the SOC is relatively small due to a difference in physical properties in comparison with a lead acid battery.

In this case, an error in an initial value of SOC, which is calculated based on the OCV, may increase.

In addition, an error in the SOC estimation for estimating SOC of the battery may be increased due to an inaccurate initial SOC.

Therefore, a service operator has sought a method for estimating an accurate initial SOC of the lithium battery.

SUMMARY

An aspect of the present disclosure provides a vehicle capable of precisely estimating an initial state of charge (SOC) of a lithium battery and a control method thereof.

Additional aspects of the present disclosure will be set forth in part in the description which follows and, in part, will be obvious from the description, or may be learned by practice of the present disclosure.

In accordance with one aspect of the present disclosure, a vehicle includes: a vehicle battery; a vehicle sensor configured to detect a current, a voltage, and a temperature of the vehicle battery; an alternator configured to output a target voltage, to the vehicle battery; and a controller configured to calculate SOC estimation based on the current, voltage, and temperature of the vehicle battery, calculate an initial SOC based on a direct current internal resistance (DCIR) map and apply the initial SOC to the SOC estimation, when an open circuit voltage (OCV) is maintained in a predetermined range after engine-off, and adjust an available SOC range based on a difference between an actual battery charge current amount, to which the initial SOC is applied, and the calculated SOC estimation. When the OCV is maintained in a predetermined range after a stabilization time of the vehicle battery elapses since the engine-off, the controller sets an initial SOC value as fault and performs a calculation algorithm of the initial SOC through the DCIR.

When the initial SOC is fault after an ignition is turned on, the controller sets a charging voltage of the vehicle battery as a first voltage through the alternator, and when the current is discharged from the vehicle battery, the controller sets the initial SOC through the DCIR map.

After setting the initial SOC, the controller sets a charging voltage of the vehicle battery as a second voltage through the output voltage control of the alternator, and starts a current integration, and when a SOC of the vehicle battery reaches a charging reference value, the controller stops the current integration and sets SOC estimation as a present current integration amount.

The controller determines whether the SOC of the vehicle battery reaches the charging reference value or not based on the charging voltage, current and engine RPM of the vehicle battery.

The controller determines whether endurance reduction of the vehicle battery occurs or not based on the actual charge amount of the vehicle battery after setting the initial SOC, and the initial SOC and the SOC estimation based on the DCIR, and adjusts the available SOC range when it is determined that the endurance reduction of the vehicle battery occurs.

The controller calculates an actual charge current amount $SOC\int I_B$ of the vehicle battery after setting the initial SOC through an Equation 1, wherein the equation 1 is $SOC\int I_B = [\text{total current integration} (\int I_B)/\text{battery capacity (Ah)}] \times 100$.

The controller adjusts the available SOC range by aggregating the minimum SOC of the predetermined available SOC range, and the difference between the actual charge current amount of the vehicle battery to which the initial SOC is applied and the calculated charge amount of the battery.

The vehicle battery is a lithium battery.

In accordance with another aspect of the present disclosure, a control method of a vehicle includes: detecting, by a vehicle sensor, a current, a voltage, and a temperature of a vehicle battery; receiving, by a controller, an engine-off signal; setting, by the controller, an initial state of charge (SOC) as a fault value, when an open circuit voltage (OCV) is maintained in a predetermined range in a SOC-OCV map; calculating, by the controller, the initial SOC based on a direct current internal resistance (DCIR) map; calculating, by the controller, SOC estimation by applying the initial SOC to which the calculated DCIR is applied; and setting, by the controller, a target voltage by using the SOC estimation and outputting the target voltage to the vehicle battery.

The control method of a vehicle may further includes: before setting the initial SOC value as fault after receiving the engine-off signal, identifying whether a stabilization time of the vehicle battery elapses after the engine-off, wherein when the stabilization time of the vehicle battery elapses, identifying whether the OCV is in a predetermined range is performed.

The calculation of the initial SOC may include when the initial SOC is fault after an ignition is turned on, charging the vehicle battery by setting a charging voltage of the vehicle battery as a first voltage through an alternator; identifying whether a discharge current of the vehicle battery is less than 0 (zero); when the discharge current is less than 0 (zero), identifying whether a discharge current variation of the vehicle battery exceeds a retention time; and when the discharge current variation of the vehicle battery exceeds the retention time, calculating DCIR and estimating the initial SOC.

The vehicle battery may be a lithium battery.

In accordance with another aspect of the present disclosure, a control method of a vehicle includes: setting, by a controller, an initial SOC based on a direct current internal resistance (DCIR) map; starting, by the controller, a current integration by setting a charging voltage of the vehicle battery as a second voltage through output voltage control of an alternator; when SOC of the vehicle battery reaches a charging reference value, stopping, by the controller, the current integration; setting, by the controller, SOC estimation as a present current integration amount; determining, by the controller, whether endurance reduction of the vehicle battery occurs or not based on an actual charge amount of the vehicle battery, the initial SOC, and an SOC estimation; and adjusting, by the controller, an available SOC range when the endurance reduction of the vehicle battery occurs.

That SOC of the vehicle battery reaches a charging reference value is determining whether the SOC of the vehicle battery reaches the charging reference value or not based on the charging voltage, current and engine RPM of the vehicle battery.

An actual charge current amount $SOC\int I_B$ of the vehicle battery after setting the initial SOC is calculated through an equation 1, wherein the equation 1 is $SOC\int I_B = [\text{total current integration }(\int I_B)/\text{battery capacity (Ah)}]\times 100$.

The adjustment of the available SOC range is performed by aggregating the minimum SOC of the predetermined available SOC range, and the difference between the actual charge current amount of the vehicle battery to which the initial SOC is applied and the calculated charge amount of the battery.

BRIEF DESCRIPTION OF THE DRAWINGS

These and/or other aspects of the disclosure will become apparent and more readily appreciated from the following description of embodiments, taken in conjunction with the accompanying drawings of which:

FIG. 10 is a flowchart illustrating a control method of a vehicle according to another exemplary embodiment of the present disclosure.

DETAILED DESCRIPTION

Figure 1:
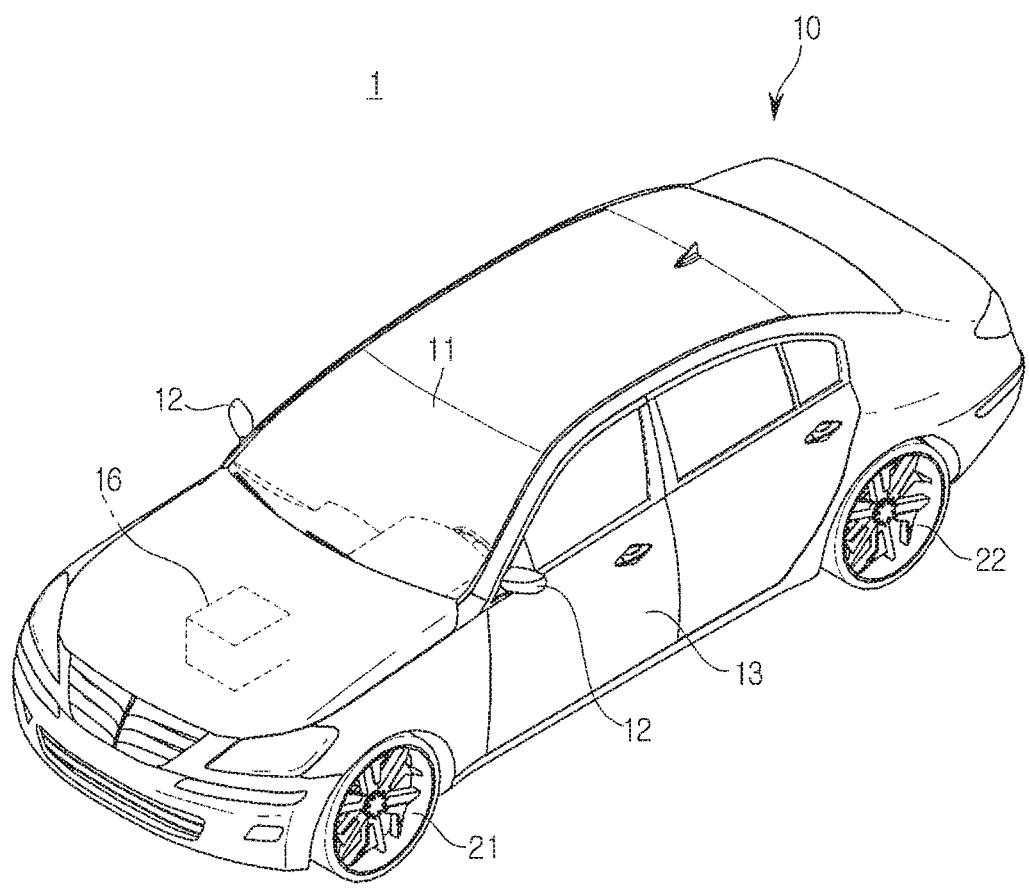
FIG. 1 is an exterior view illustrating a vehicle according to an exemplary embodiment of the present disclosure.

In the following description, like reference numerals refer to like elements throughout the specification. Well-known functions or constructions are not described in detail since they would obscure the one or more exemplar embodiments with unnecessary detail. Terms such as "unit", "module", "member", and "block" may be embodied as hardware or software. According to embodiments, a plurality of "unit", "module", "member", and "block" may be implemented as a single component or a single "unit", "module", "member", and "block" may include a plurality of components.

It will be understood that when an element is referred to as being "connected" another element, it can be directly or indirectly connected to the other element, wherein the indirect connection includes "connection via a wireless communication network".

When a part "includes" or "comprises" an element, unless there is a particular description contrary thereto, the part may further include other elements, not excluding the other elements.

It will be understood that, although the terms first, second, third, etc., may be used herein to describe various elements, but is should not be limited by these terms. These terms are only used to distinguish one element from another element.

As used herein, the singular forms "a," "an" and "the" are intended to include the plural forms as well, unless the context clearly indicates otherwise.

An identification code is used for the convenience of the description but is not intended to illustrate the order of each step. The each step may be implemented in the order different from the illustrated order unless the context clearly indicates otherwise.

Reference will now be made in detail to embodiments of the present disclosure, examples of which are illustrated in the accompanying drawings.

FIG. 1 is an exterior view illustrating a vehicle.

Referring to FIG. 1, an exterior of a vehicle 1 may include a body 10 forming an exterior of the vehicle 1, a windscreen 11 providing a front view of the vehicle 1 to a driver, a side mirror 12 providing a view of a rear side of the vehicle 1 to the driver, a door 13 closing the inside of the vehicle 1 from the outside, and vehicle wheels 21 and 22 moving the vehicle 1 by including a front wheel 21 disposed on a front side of the vehicle and a rear wheel 22 disposed on a rear side of the vehicle.

The windscreen 11 may be provided on an upper portion of the front of the body 10 to allow a driver inside the vehicle 1 to acquire visual information about the front of the vehicle 1. The side mirror 12 may include a left side mirror provided on the left side of the body 10 and a right side mirror provided on the right side of the body 10, and may allow a driver inside the vehicle 1 to acquire visual information of the lateral side and the rear side of the vehicle 1.

The door 13 may be rotatably provided on a right side and a left side of the body 10. When the door 13 is opened, a driver may be allowed to be seated in the vehicle 1, and when the door 13 is closed, the inside of the vehicle 1 may be closed from the outside.

In addition to above mentioned components, the vehicle 1 may include a driving device (not shown) configured to rotate the wheels 21 and 22, a steering system (not shown) configured to change the driving direction of the vehicle 1, and a brake system (not shown) configured to stop the driving of the wheels.

The driving device (not shown) may supply a torque to the front wheel 21 or the rear wheel 22 so that the body 10 may be moved back and forth. The driving device (not shown) may include an engine configured to generate a torque by burning the fossil or a motor configured to generate a torque by receiving the power from a battery (not shown).

The steering system may include a steering wheel 42 (refer to FIG. 2) receiving a driving direction from a driver, a steering gear (not shown) changing a rotary motion of the steering wheel to a reciprocating motion, and a steering link (not shown) delivering the reciprocating motion of the steering gear (not shown) to the front wheel 21. Accordingly, the steering system may change the driving direction of the vehicle 1 by changing the direction of the rotary axis of the wheels.

The brake system may include a brake pedal (not shown) receiving a brake operation from a driver, a brake drum (not shown) coupled to the wheels 21 and 22, and a brake shoe (not shown) stopping the rotation of the brake drum (not shown) by using friction force. Accordingly, the brake system may stop the driving of the vehicle 1 by stopping the rotation of the wheels 21 and 22.

Figure 2:
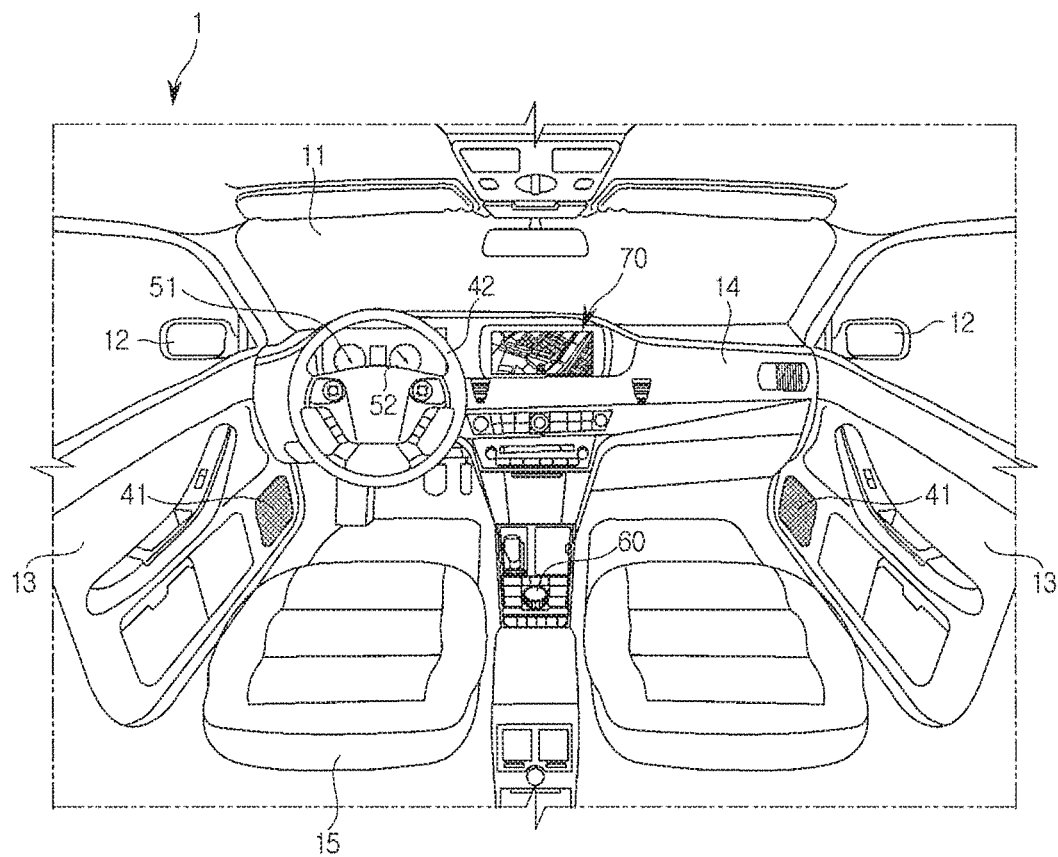
FIG. 2 is a view of an interior of the vehicle.

FIG. 2 is a view of an interior of the vehicle.

The interior of the vehicle 1 may include a dashboard 14 in which a variety of devices are installed to allow a driver to operate the vehicle 1, a driver seat 15 in which the driver is seated, a cluster display 51 and 52 configured to display operation information of the vehicle 1, and a navigation system 70 configured to perform an audio function and a video function as well as a navigation function guiding a driving route from a departure to a destination in response to an operation command of the driver.

The dashboard 14 may protrude from a lower side of the windscreen 11 to the driver so that the driver may operate a variety of devices installed in the dashboard 14 while staring at the front.

The driver seat 15 may be provided in a rear side of the dashboard 14 so that the driver may drive the vehicle 1 in a stable position while staring at the front and the variety of devices of the dashboard 14.

The cluster display 51 and 52 may be provided in the driver seat 15 of the dashboard 14 and include a speedometer 51 indicating a driving speed of the vehicle 1 and a revolutions per minute (RPM) gauge 52 indicating a rotation speed of a driving device (not shown).

The navigation system 70 may include a display displaying road information related to the traveling road of the vehicle 1 or a route to a destination; and a speaker 41 outputting a sound according to an operation command of the driver. In recent, an audio video navigation (AVN) device has been developed so that an audio device, a video device and a navigation device are integrally formed is installed in a vehicle.

The navigation system 70 may be installed in a center fascia. The center fascia may represent a control panel between a driver seat and a passenger seat in the dash board 14, and may represent a portion in which the dash board 14 and a shift lever are vertically joined. In addition, an air conditioning device, a heater controller, a blowing port, a cigar jack, an ashtray, and a cup holder as well as the navigation system 70 may be installed in the center fascia. The center fascia together with a center console may distinguish between the driver seat and the passenger seat.

The vehicle 1 may have an additional jog dial 60 to operate to drive a variety of devices including the navigation system 70.

According to the present disclosure, the jog dial 60 may perform an operation by being rotated or pressed, and may be provided with a touch pad having a touch recognition function to perform a handwriting recognition by using the user's finger or an additional device having a touch recognition function.

Figure 3:
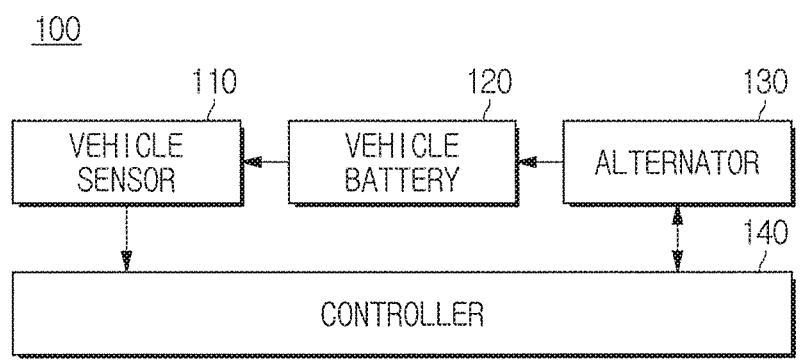
FIG. 3 is a control block diagram illustrating a configuration of the vehicle.

FIG. 3 is a control block diagram illustrating a configuration of the vehicle.

FIGS. 4 to 7C are views illustrating a method of setting an initial state of charge (SOC) of the vehicle according to an exemplary embodiment of the present disclosure. The following description will be described with reference to FIGS. 4 to 7C.

Referring to FIG. 3, a vehicle 100 may include a vehicle sensor 110, a vehicle battery 120, an alternator 130, and a controller 140.

The vehicle sensor 110 may be configured to measure a current, a voltage, and a temperature of the vehicle battery 120, but is not limited thereto.

The vehicle battery 120 may be a lithium battery, e.g., a 12V LFP (LiFePO$_4$) battery.

The alternator 130 may output a target voltage, which is set by a generation control in response to a control of the controller 140, to the vehicle battery 120.

The controller 140 may calculate SOC estimation based on the current, voltage, and temperature of the vehicle battery 120. When an open circuit voltage (OCV) is maintained in a predetermined range after engine-off, the controller 140 may calculate an initial SOC through a direct current internal resistance (DCIR) and apply the initial SOC to the SOC estimation. The controller 140 may adjust an available SOC range based on the difference between an actual battery charge current amount, to which the initial SOC is applied, and the calculated battery charge amount.

Particularly, when the OCV is maintained in a predetermined range after a stabilization time of the vehicle battery 120 elapses since the engine-off, the controller 140 may set the initial SOC value as a "fault" and perform a calculation algorithm of the initial SOC through the DCIR. At this time, the fact that the OCV is maintained within the predetermined range represents that there is too minute difference to set the initial SOC.

Figure 4:
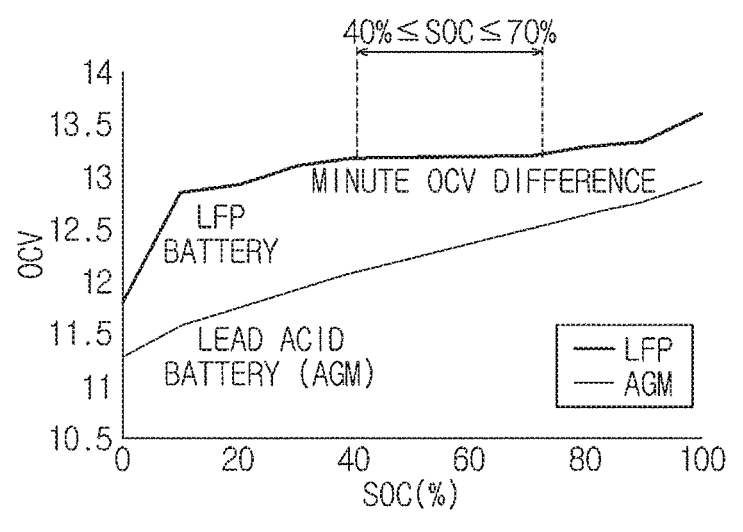
FIGS. 4 to 7C are views illustrating a method of setting an initial state of charge (SOC) of the vehicle.
Figure 5:
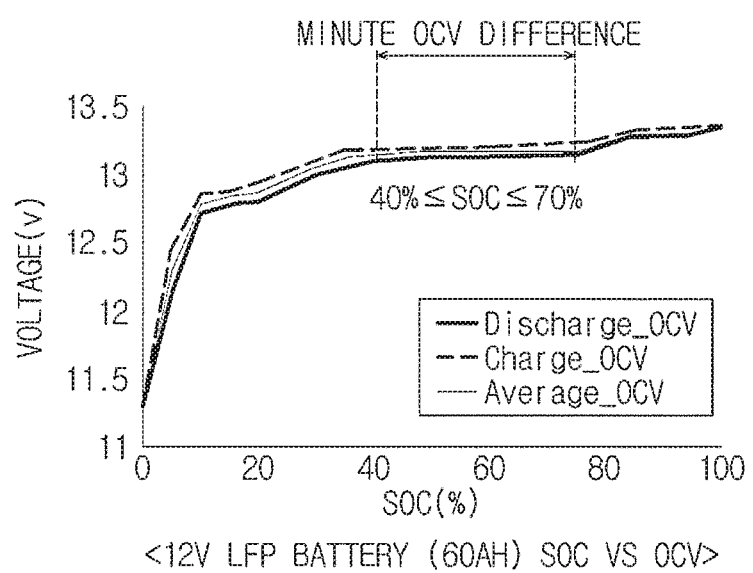

Referring to FIGS. 4 and 5, when the vehicle battery 120 is a 12V LEP battery, SOC estimation of the battery may be performed by integrating a current based on the initial SOC value.

The controller 140 may estimate the SOC estimation as $$SOC_{Ini} + \frac{\int (\eta \times I_B)dt}{C_B} \times 100\%.$$

Here, $SOC_{ini}$ may represent an initial SOC, $C_B$ may represent a battery rated capacity, $\eta$ may represent a charge and discharge efficiency, and $I_B$ may represent a charge and discharge current.

The initial SOC may be estimated via OCV at the elapse of the battery chemical stabilization time after the engine-off. As for the 12V LFP battery, a region (40%≤SOC≤70%) in which OCV according to the SOC is flat may be present. In a state in which the OCV is maintained in the predetermined range, when setting an initial SOC based on the fact that the OCV is maintained in the predetermined range, an error in the SOC estimation may be increased. The SOC estimation error may lead to reduction in the durability of the vehicle battery and may lead to difficulty in the efficient management and control of the electrical energy.

Figure 6:
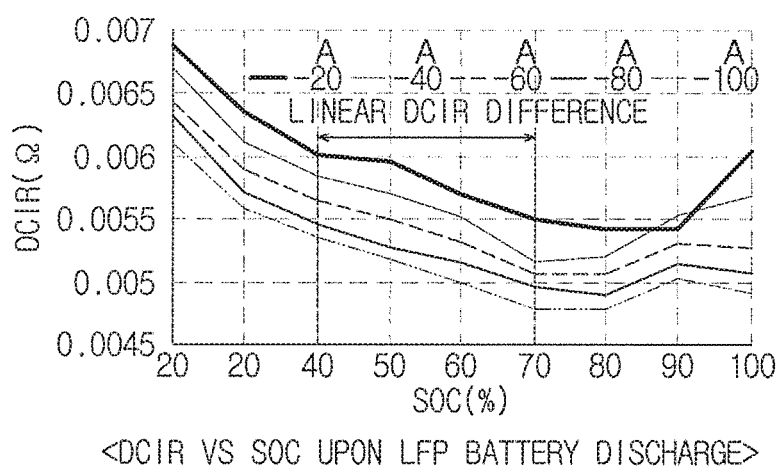

As illustrated in FIG. 6, according to an exemplary embodiment of the present disclosure, the initial SOC is calculated based on the DCIR indicating a linear difference in a section in which the OCV is maintained in the predetermined range.

Particularly, when the initial SOC is fault after an ignition is turned on, the controller 140 may set a charging voltage of the vehicle battery 120 as a first voltage through the alternator 130, and when the current is discharged from the vehicle battery 120, the controller 140 may set the initial SOC through the DCIR map.

Referring to FIG. 6, it is confirmed that the DCIR value has a linear electrical characteristic about the SOC when the SOC is 40% to 70% at the time of discharging a lithium iron phosphate (LFP) battery.

With this principle, when the initial SOC is fault after an ignition is turned on, the controller 140 may set a charging voltage of the vehicle battery 120 to be low through the alternator 130 so that the current is discharged. At this time, setting the charging voltage of the vehicle battery to be low may represent that by setting the output voltage of the alternator 130 as a low level, the power of electric field load is supplied via the vehicle battery and thus the current is discharged. In this time, the charging voltage may be arbitrarily set by an operator.

When the vehicle battery 120 is discharged with a certain current, the controller 140 may calculate DCIR by using an equation of $$\frac{V_2 - V_1}{I}.$$

$V_1$ may be an initial voltage, $V_2$ may be a voltage when a certain period of time elapses after the start of current discharge, and I may be a discharge current for a certain period of time.

The controller 140 may calculate an initial SOC ($SOC_{DCIR\ Ini}$) via a DCIR map (discharge current vs SOC) based on the calculated DCIR.

After setting the initial SOC ($SOC_{DCIR\ Ini}$), the controller 140 may set a charging voltage of the vehicle battery 120 as a second voltage through the output voltage control of the alternator 130, and start a current integration. When the SOC of the vehicle battery 120 reaches a charging reference value, the controller 140 may stop the current integration and set the SOC estimation as a present current integration amount.

At this time, the controller 140 may determine whether the SOC of the vehicle battery 120 reaches the charging reference value or not based on the charging voltage, current and engine RPM of the vehicle battery 120.

For example, the controller 140 may determine that the SOC of the vehicle battery has reached the charging reference value when conditions such as the second voltage corresponding to the charging voltage of the vehicle battery 120, $\Delta I_B < 0$ and $\Delta rpm \geq 0$ are satisfied.

The controller 140 may convert a total current integration of the vehicle battery 120 from the start of charging the vehicle battery 120 until the charging reference value into $SOC\int I_B$ by using the second voltage. That is, the controller 140 may calculate an actual charge current amount $SOC\int I_B$ of the vehicle battery after setting the initial SOC through an Equation 1.

$SOC\int I_B$=[total current integration ($\int I_B$)/battery capacity (Ah)]×100  [Equation 1]

The controller 140 may determine whether endurance reduction of the vehicle battery occurs or not based on the actual charge amount of the vehicle battery after setting the initial SOC, and the initial SOC and the SOC estimation based on the DCIR, and adjust the available SOC range when it is determined that the endurance reduction of the vehicle battery occurs.

Particularly, when the SOC of the vehicle battery 120 reaches the charging reference value, the controller 140 may acquire a difference ($SOC_{Diff}$) between the charging reference value and the initial SOC ($SOC_{DCIR\ Ini}$) set by the DCIR.

When a difference between $SOC_{Diff}$ and $SOC\int I_B$ is equal to or greater than a reference value (e.g., 10%), the controller 140 may determine that the endurance reduction of the vehicle battery occurs and adjust the available SOC range.

For example, when the difference between $SOC_{Diff}$ and $SOC\int I_B$ is less than 10% (i.e., [$SOC_{Diff}$−$SOC\int I_B$]<10%), the controller 140 may determine that the endurance reduction of the vehicle battery does not occur and maintain the available SOC range as a range of $SOC_{MIN}$<SOC<$SOC_{MAX}$. In addition, when the difference between $SOC_{Diff}$ and $SOC\int I_B$ is equal to or greater than 10% (i.e., [$SOC_{Diff}$−$SOC\int I_B$]≥10%), the controller 140 may determine that the endurance reduction of the vehicle battery occurs and change the available SOC range into a range of $SOC_{MIN+10\%}$<SOC<$SOC_{MAX}$.

At this time, the controller 140 may adjust the available SOC range by aggregating the minimum SOC of the predetermined available SOC range, and the difference between the actual charge current amount of the vehicle battery to which the initial SOC is applied and the calculated charge amount of the battery.

For example, when the available SOC range upon non-occurrence of the endurance reduction of the vehicle battery is SOC 50%-SOC 100% and when SOC on is 10%, the controller 40 may change the available SOC range upon non-occurrence of the endurance reduction of the vehicle battery into SOC 60%-SOC 100%.

According to an exemplary embodiment of the present disclosure, it may be possible to prevent the acceleration of the endurance reduction by reducing the available SOC, since the capacity of the battery is reduced due to the occurrence of the endurance reduction of the vehicle battery 120.

According to an exemplary embodiment of the present disclosure, when it is in a region, in which it is difficult to set the initial SOC through OCV, it may be possible to reset the SOC estimation through the charge after setting the initial SOC by using DCIR. Accordingly, during the process, it may be possible to identify whether the endurance reduction is in progress, or not.

Figure 7A:
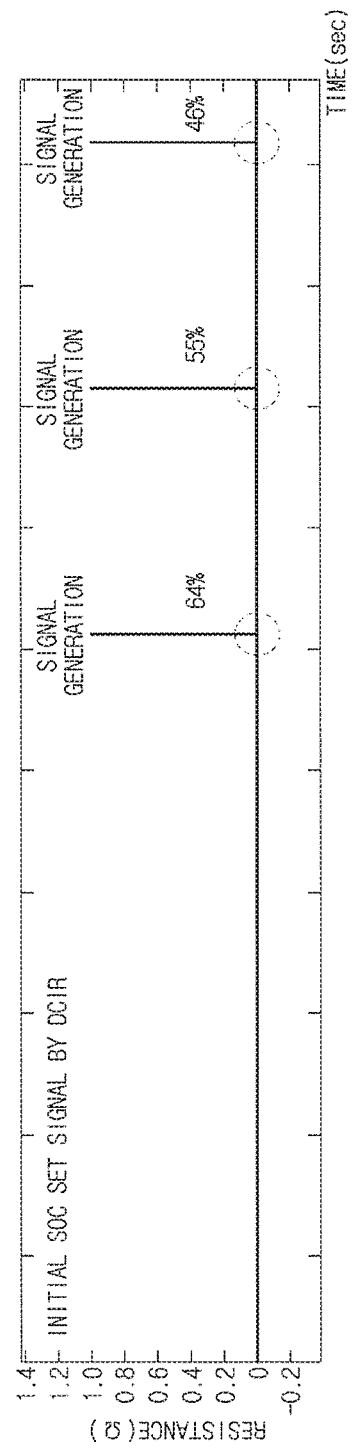
Figure 7B:
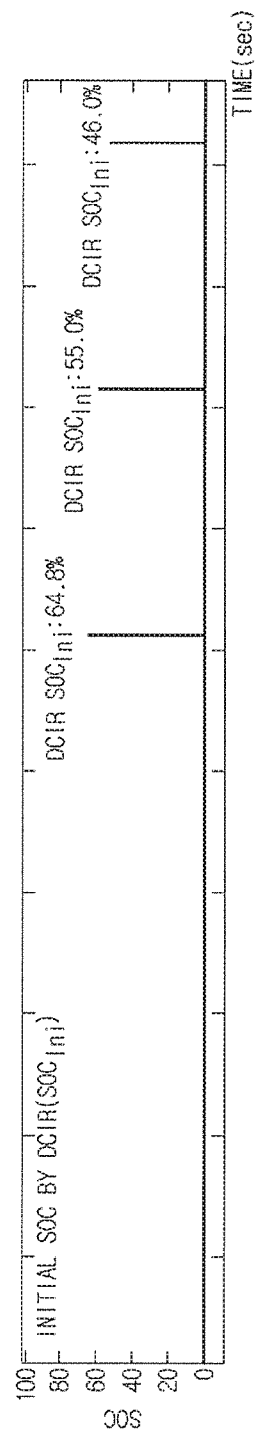
Figure 7C:
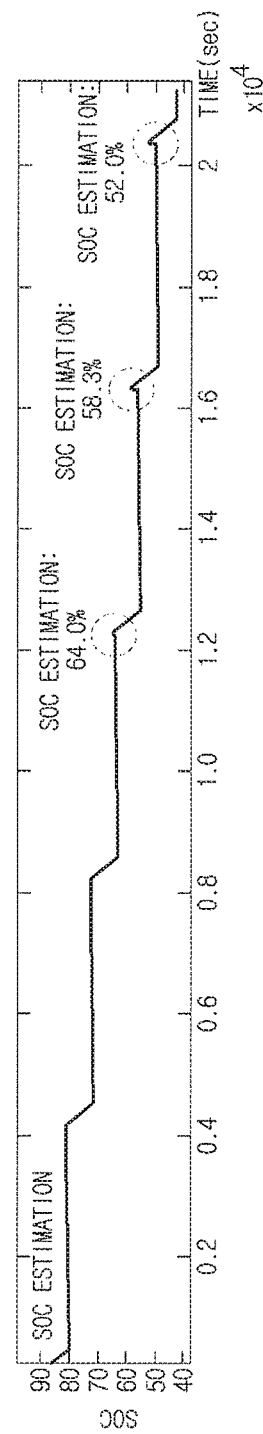

FIGS. 7A-7C illustrate a graph of an initial SOC set signal by DCIR, a graph of an initial SOC by DCIR, and a graph of SOC estimation. According to the verification result through the graphs, it may be confirmed that setting the initial SOC based on DCIR is appropriate.

The controller 140 may set the initial SOC through the OCV in a region in which the OCV is not flat (SOC<40% or SOC>70%).

The controller 140 may be implemented using a memory (not shown) storing an algorithm for controlling an operation of components in the vehicle 100 and data related to programs implementing the algorithm, and a processor (not shown) performing the above mentioned operation using the data stored in the memory. The memory and the processor may be implemented in separate chips, or a single chip.

Although not shown, the vehicle 100 may further include a communicator, an input, a storage, and a display.

The communicator may include one or more components configured to allow the communication with an external device, wherein the communicator may include at least one of a short range communication module, a wired communication module, and a wireless communication module.

The short-range communication module may include a variety of short range communication modules, which is configured to transmit and receive a signal using a wireless communication module in the short range, e.g., Bluetooth module, Infrared communication module, Radio Frequency Identification (RFID) communication module, Wireless Local Access Network (WLAN) communication module, NFC communications module, and ZigBee communication module.

The wired communication module may include a variety of wired communication module, e.g., Controller Area Network (CAN) communication module, Local Area Network (LAN) module, Wide Area Network (WAN) module, or Value Added Network (VAN) module and a variety of cable communication module, e.g., Universal Serial Bus (USB), High Definition Multimedia Interface (HDMI), Digital Visual Interface (DVI), recommended standard 232 (RS-232), or plain old telephone service (POTS).

The wireless communication module may include a wireless communication module supporting a variety of wireless communication methods, e.g., Radio Data System-Traffic Message Channel (RDS-TMC), Digital Multimedia Broadcasting (DMB), Wifi module, Wireless broadband module, global System for Mobile (GSM) Communication, Code Division Multiple Access (CDMA), Wideband Code Division Multiple Access (WCDMA), Time Division Multiple Access (TDMA), and Long Term Evolution (LTE).

The wireless communication module may include a wireless communication interface having an antenna and a receiver that receive traffic information signals. In addition, the wireless communication module may further include a traffic information signal conversion module for demodulating an analogy wireless signal received via the wireless communication interface, into a digital control signal The communicator may further include an internal communication module (not shown) for the communication among the electronic devices in the vehicle 100. The internal communication protocol of the vehicle 100 may include Controller Area Network (CAN), Local Interconnection Network (LIN), FlexRay, or Ethernet.

The input may include hardware type devices, e.g., a variety of buttons, switches, pedals, keyboards, mouse, track-balls, a variety levers, handles and sticks, for the input by a user.

The input may include software type devices, e.g., Graphical User interface (GUI) such as a touch pad for the input by a user. The touch pad may be implemented by Touch Screen Panel (TSP) and thus the touch pad may have a layer structure with the display 140.

The storage may store a variety of information related to the vehicle 100 such as a variety of standards to determine a collision between a door and an obstacle, a door emergency opening, and a door manual opening mode conversion.

The storage may be implemented using at least one of a non-volatile memory element, e.g., a cache, a Read Only Memory (ROM), a Programmable ROM (PROM), an Erasable Programmable ROM (EPROM), an Electrically Erasable Programmable ROM (EEPROM) and a flash memory, a volatile memory element, e.g., a Random Access Memory (RAM), or a storage medium, e.g., a Hard Disk Drive (HDD) and a CD-ROM. The implementation of the storage is not limited thereto. The storage 130 may be a memory that is implemented by a separate memory chip from the aforementioned processor related to the controller 140 or the storage may be implemented by a single chip with a processor.

The display may be implemented by Cathode Ray Tube (CRT), Digital Light Processing (DLP) panel, Plasma Display Penal, Liquid Crystal Display (LCD) panel, Electro Luminescence (EL) panel, Electrophoretic Display (EPD) panel, Electrochromic Display (ECD) panel, Light Emitting Diode (LED) panel or Organic Light Emitting Diode (OLED) panel. The implementation of the display is not limited thereto.

Figure 8:
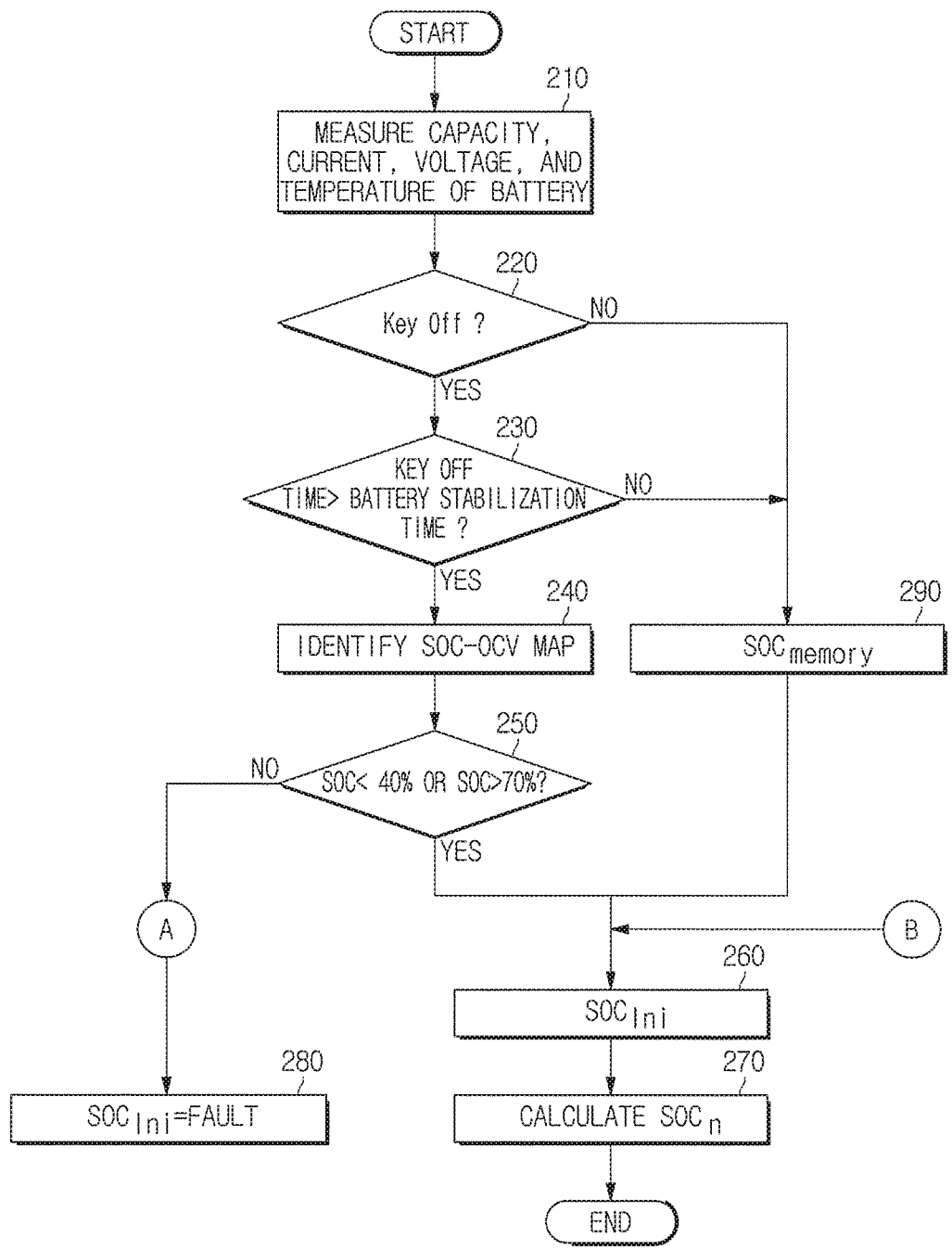
FIGS. 8 and 9 are flowcharts illustrating a control method of the vehicle according to an exemplary embodiment of the present disclosure.
Figure 9:
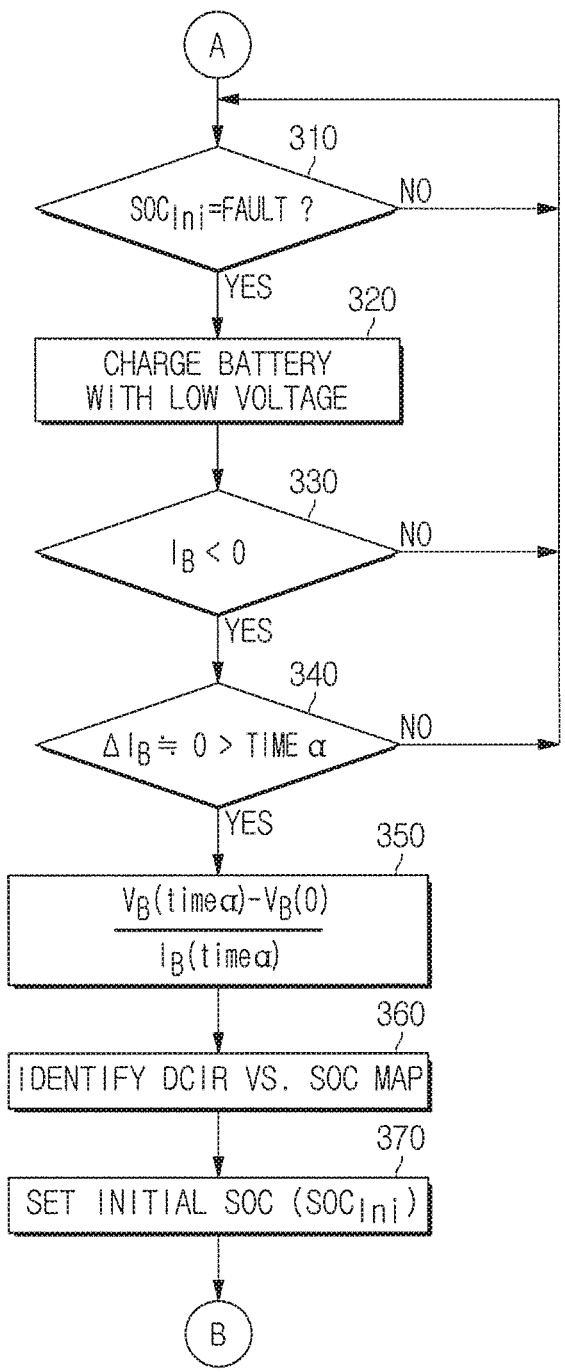

FIGS. 8 and 9 are flowcharts illustrating a control method of the vehicle according to an exemplary embodiment of the present disclosure.

Referring to FIG. 8, the vehicle 100 may measure the current, voltage, and, temperature of the vehicle battery 120 (210). The vehicle battery 120 may be a lithium battery.

Next, the vehicle 100 may receive an engine-off signal (220).

Then, the vehicle 100 may identify whether a stabilization time of the vehicle battery 120 elapses after receiving the engine-off signal (230).

When the stabilization time of the vehicle battery 120 elapses, the vehicle 100 may confirm the state of charge (SOC)-open circuit voltage (OCV) map (refer to FIG. 5) (240), and identify whether the OCV is a range in which it is possible to set the initial SOC through the OCV, on the SOC-OCV map (250).

When the OCV is in the range in which it is possible to set the initial SOC through the OCV (e. g., SOC<40% or SOC>70%), the vehicle 100 may set the initial SOC based on the OCV (260), set a target voltage by calculating the SOC estimation (SOCn) based on the initial SOC, and output the target voltage to the vehicle battery 120 (270). The SOC estimation (SOCn) may be estimated as $$SOC_{Ini} + \frac{\int (\eta \times I_B) dt}{C_B} \times 100\%.$$

In this case, $SOC_{Ini}$ may represent the initial SOC, $C_B$ may represent a battery rated capacity, $\eta$ may represent a charge and discharge efficiency, and $I_B$ may represent a charge and discharge current.

When the OCV is maintained in the range in which it is impossible to set the initial SOC through the OCV (e.g., 40%≤SOC≤70%), the vehicle 100 may set the initial SOC value as "fault" (i.e., $SOC_{Ini}$=Fault) (280). The vehicle 100 may stop the generation control by outputting a fault signal until the initial SOC is set through direct current internal resistance (DCIR).

Referring to FIG. 9, the vehicle 100 may calculate the initial SOC through the DCIR map.

Particularly, when the initial SOC is fault after the ignition is turned on (310), the vehicle 100 may set a charging voltage of the vehicle battery 120 as a first voltage to charge the battery for the vehicle (320). At this time, the first voltage may represent a low voltage to drive some loads in the vehicle so as to generate the discharge current in the vehicle 100, which may be set arbitrarily by an operator.

The vehicle 100 may identify whether the discharging current ($I_B$) of the vehicle battery 120 is less than 0 (zero) (330).

When the discharge current is less than 0 (zero), the vehicle 100 may identify whether the discharge current variation ($\Delta I_B$) of the vehicle battery 120 exceeds a retention time (Time α) (340).

When the discharge current variation ($\Delta I_B$) of the vehicle battery 120 exceeds a retention time (Time α), the vehicle 100 may calculate DCIR and estimate the initial SOC (350~370).

Particularly, the vehicle 100 may calculate the DCIR by using $V_B$(Time α)–$V_B$(0)/$I_B$(Time α). $V_B$(Time α) may represent a battery voltage after α time, $V_B$(0) may represent an initial discharge voltage of battery and $I_B$(Time α) may represent a retention discharge current for a time.

The vehicle 100 may set the initial SOC based on the DCIR-SOC map (DCIR map) to which the calculated DCIR is applied.

Next, the vehicle 100 may calculate the SOC estimation by applying the initial SOC to which the calculated DCIR of FIG. 8 is applied (260).

The vehicle 100 may set a target voltage using the SOC estimation of FIG. 8 and output the target voltage to the vehicle battery (270).

When the engine-off signal is not received in the step 220 of FIG. 8 and the battery stabilization time has not elapsed in the step 230, the vehicle 100 may apply the SOC which is pre-stored in previous step (290) and perform from the step 260.

FIG. 10 is a flowchart illustrating a control method of a vehicle according to another exemplary embodiment of the present disclosure.

Referring to FIG. 10, the vehicle 100 may set an initial $SOC_{Ini}$ through the DCIR (410). This may be the same as step 370 of FIG. 9.

The vehicle 100 may start a current integration by setting the charging voltage of the vehicle battery 120 as a second voltage through the output voltage control of the alternator 130 (420).

The vehicle 100 may stop the current integration when the SOC of the vehicle battery 120 reaches the charging reference value, and set the SOC estimation as the present current integration (430 and 440).

Particularly, the vehicle 100 may determine whether the SOC of the vehicle battery 120 reaches the charging reference value based on the charging voltage, current and engine RPM of the vehicle battery 120.

For example, when conditions such as the second voltage corresponding to the charging voltage of the vehicle battery 120, $\Delta I_B<0$ and $\Delta rpm \geq 0$ are satisfied, the vehicle 100 may determine that SOC of the vehicle battery 120 reaches the charging reference value.

The vehicle 100 may determine whether endurance reduction of the vehicle battery occurs or not based on the actual charge amount of the vehicle battery after setting the initial SOC, and the initial SOC and the SOC estimation based on the DCIR (450).

The vehicle 100 may convert a total current integration of the vehicle battery 120 from the start of charging the vehicle battery 120 until the charging reference value into $SOC\int I_B$ by using the second voltage. That is, the vehicle 100 may calculate the actual charge current amount $SOC\int I_B$ of the vehicle battery after setting the initial SOC through the Equation 1.

The vehicle 100 may determine whether endurance reduction of the vehicle battery occurs or not based on the actual charge amount of the vehicle battery after setting the initial SOC, and the initial SOC and the SOC estimation based on the DCIR, and adjust the available SOC range when it is determined that the endurance reduction of the vehicle battery occurs.

Particularly, when the SOC of the vehicle battery 120 reaches the charging reference value, the controller 140 may acquire a difference ($SOC_{Diff}$) between the charging reference value and the initial SOC ($SOC_{DCIR\ Ini}$) set by the DCIR.

When it is determined that the endurance reduction of the vehicle battery occurs, the vehicle 100 may adjust the available SOC range (460).

When a difference between $SOC_{Diff}$ and $SOC\int I_B$ is equal to or greater than a reference value (e.g., 10%), the vehicle 100 may determine that the endurance reduction of the vehicle battery occurs and adjust the available SOC range.

For example, when the difference between $SOC_{Diff}$ and $SOC\int I_B$ is less than 10% (i.e., $[SOC_{Diff}-SOC\int I_B]<10\%$), the controller 140 may determine that the endurance reduction of the vehicle battery does not occur and maintain the available SOC range as a range of $SOC_{MIN}<SOC<SOC_{MAX}$. In addition, when the difference between $SOC_{Diff}$ and $SOC\int I_B$ is equal to or greater than 10% (i.e., $[SOC_{Diff}-SOC\int I_B]\geq 10\%$), the controller 140 may determine that the endurance reduction of the vehicle battery occurs and change the available SOC range into a range of $SOC_{MIN+10\%}<SOC<SOC_{MAX}$.

At this time, the vehicle 100 may adjust the available SOC range by aggregating the minimum SOC of the predetermined available SOC range and the difference between the actual charge current amount of the vehicle battery to which the initial SOC is applied and the calculated charge amount of the battery.

For example, when the available SOC range upon non-occurrence of the endurance reduction of the vehicle battery is SOC 50%~SOC 100% and when $SOC_{Diff}$ is 10%, the vehicle 100 may change the available SOC range upon non-occurrence of the endurance reduction of the vehicle battery into SOC 60%~SOC 100%.

As is apparent from the above description, it may be possible to improve the reliability of the initial SOC since the initial SOC is set by using the DCIR value.

Since it is possible to precisely set the initial SOC, it may be possible to reduce the error in the SOC estimation that is calculated by using the initial SOC.

In addition, since the available SOC range is adjusted by comparing the actual charge current amount of the battery to which the initial SOC, which is set by using the DCIR, is applied, with the calculated value, it may be possible to prevent the durability reduction of the vehicle battery in advance.

The disclosed embodiments may be implemented as a recording medium storing a command executable by a computer. The command may be stored in the program code type. When executed by the processor, a program module may be generated and perform the disclosed embodiments. The recording medium may be implemented as a computer readable recording medium.

The disclosed embodiments may be implemented as a computer code on a computer readable recording medium. The computer readable recording medium may include various kinds of recording medium stored data decrypted by the computer system. For example, there may be a Read Only Memory (ROM), a Random Access Memory (RAM), a magnetic tape, a magnetic disk, a flash memory, and an optical data storage device Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A vehicle comprising:
a vehicle battery;
a vehicle sensor configured to detect a current, a voltage, and a temperature of the vehicle battery;
an alternator configured to output a target voltage to the vehicle battery; and
a controller configured to:
calculate state of charge (SOC) estimation based on the current, voltage, and temperature of the vehicle battery,
calculate an initial SOC based on a direct current internal resistance (DCIR) map and apply the initial SOC to the SOC estimation, when an open circuit voltage (OCV) is maintained in a predetermined range after engine off, and adjust an available SOC range based on a difference between an actual battery charge current amount, to which the initial SOC is applied, and the calculated SOC estimation.

2. The vehicle of claim 1, wherein
when the OCV is maintained in the predetermined range after a stabilization time of the vehicle battery elapses since the engine-off, the controller sets the initial SOC as a fault value and performs a calculation algorithm of the initial SOC through the DCIR map.

3. The vehicle of claim 2, wherein
when the initial SOC is the fault value after an ignition is turned on, the controller sets a charging voltage of the vehicle battery as a first voltage through the alternator, and
when the current is discharged from the vehicle battery, the controller sets the initial SOC based on the DCIR map.

4. The vehicle of claim 3, wherein
after the initial SOC is set, the controller sets the charging voltage of the vehicle battery as a second voltage through output voltage control of the alternator, and starts a current integration, and
when an SOC of the vehicle battery reaches a charging reference value, the controller stops the current integration and sets the SOC estimation as a present current integration amount.

5. The vehicle of claim 4, wherein
the controller determines whether the SOC of the vehicle battery reaches the charging reference value or not based on the charging voltage, the current, and an engine revolutions per minute (RPM) of the vehicle battery.

6. The vehicle of claim 4, wherein
after the initial SOC is set, the controller determines whether endurance reduction of the vehicle battery occurs or not based on the actual battery charge current amount, the calculated initial SOC, and the calculated SOC estimation, and adjusts the available SOC range when it is determined that the endurance reduction of the vehicle battery occurs.

7. The vehicle of claim 6,
wherein the controller calculates the actual battery charge current amount of the vehicle battery after setting the initial SOC based on the following equation:
$SOC\int I_B = (\int I_B / Ah) \times 100$, wherein $SOC\int I_B$ is the actual charge current amount of the vehicle battery, $\int I_B$ is a total current integration, and Ah is a battery capacity.

8. The vehicle of claim 1, wherein
the controller adjusts the available SOC range by aggregating a minimum SOC of the available SOC range, and the difference between the actual charge current amount of the vehicle battery to which the initial SOC is applied and the calculated SOC estimation.

9. The vehicle of claim 1, wherein
the vehicle battery is a lithium battery.

10. A control method of a vehicle comprising steps of:
detecting, by a vehicle sensor, a current, a voltage, and a temperature of a vehicle battery;
receiving, by a controller, an engine-off signal; setting, by the controller, an initial state of charge (SOC) as a fault value, when an open circuit voltage (OCV) is maintained in a predetermined range in a SOC-OCV map;
calculating, by the controller, the initial SOC based on a direct current internal resistance (DCIR) map; calculating, by the controller, SOC estimation by applying the initial SOC; and
setting, by the controller, a target voltage by using the SOC estimation and outputting the target voltage to the vehicle battery.

11. The control method of claim 10, further comprising:
before the step of setting the initial SOC as the fault value after receiving the engine-off signal, identifying whether a stabilization time of the vehicle battery elapses after the engine-off,
wherein when the stabilization time of the vehicle battery elapses, identifying whether the OCV is in a predetermined range.

12. The control method of claim 10, wherein
the step of calculating the initial SOC comprises:
when the initial SOC is the fault value after an ignition is turned on, charging the vehicle battery by setting a charging voltage of the vehicle battery as a first voltage through an alternator;
identifying whether a discharge current of the vehicle battery is less than 0 (zero);
when the discharge current is less than 0 (zero), identifying whether a discharge current variation of the vehicle battery exceeds a retention time; and
when the discharge current variation of the vehicle battery exceeds the retention time, calculating DCIR and estimating the initial SOC.

13. The control method of claim 10, wherein
the vehicle battery is a lithium battery.

14. A control method of a vehicle comprising steps of:
setting, by a controller, an initial SOC based on a direct current internal resistance (DCIR) map;
starting, by the controller, a current integration by setting a charging voltage of a vehicle battery as a second voltage through output voltage control of an alternator;
when an SOC of the vehicle battery reaches a charging reference value, stopping, by the controller, the current integration;
setting, by the controller, SOC estimation as a present current integration amount;
determining, by the controller, whether endurance reduction of the vehicle battery occurs or not based on an actual charge current amount of the vehicle battery, the initial SOC, and the SOC estimation; and
adjusting, by the controller, an available SOC range when the endurance reduction of the vehicle battery occurs.

15. The control method of claim 14, wherein
whether the SOC of the vehicle battery reaches the charging reference value or not is determined based on the charging voltage, current and engine RPM of the vehicle battery.

16. The control method of claim 14, wherein
the actual charge current amount of the vehicle battery is calculated based on the following equation, $$SOC\int I_B = (\int I_B / Ah) \times 100,$$

wherein $SOC\int I_B$ is the actual charge current amount of the vehicle battery, $\int I_B$ is a total current integration, and Ah is a battery capacity.

17. The control method of claim 14, wherein
the step of adjusting the available SOC range is performed by aggregating a minimum SOC of the available SOC range, and a difference between the actual charge current amount of the vehicle battery to which the initial SOC is applied and the calculated charge amount of the battery.

* * * * *